United States Patent
Lin et al.

(10) Patent No.: US 10,879,176 B2
(45) Date of Patent: Dec. 29, 2020

(54) INTEGRATED CIRCUIT STRUCTURE

(71) Applicant: Taiwan Semiconductor Manufacturing Co., Ltd., Hsinchu (TW)

(72) Inventors: Yi-Hsiung Lin, Zhubei (TW);
Shang-Wen Chang, Zhubei (TW);
Yi-Hsun Chiu, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 72 days.

(21) Appl. No.: 16/251,439

(22) Filed: Jan. 18, 2019

(65) Prior Publication Data
US 2020/0135644 A1    Apr. 30, 2020

Related U.S. Application Data

(60) Provisional application No. 62/751,137, filed on Oct. 26, 2018.

(51) Int. Cl.
*H01L 23/528*    (2006.01)
*H01L 23/48*    (2006.01)

(52) U.S. Cl.
CPC ........ *H01L 23/5286* (2013.01); *H01L 23/481* (2013.01)

(58) Field of Classification Search
CPC .............. H01L 23/481; H01L 23/5286; H01L 29/41725; H01L 23/485; H01L 23/535; H01L 23/528
See application file for complete search history.

(56) References Cited

U.S. PATENT DOCUMENTS 10,192,819 B1 *   1/2019   Chanemougame ... H01L 27/092

* cited by examiner

*Primary Examiner* — Jasmine J Clark
(74) *Attorney, Agent, or Firm* — Birch, Stewart, Kolasch & Birch, LLP

(57) ABSTRACT

An integrated circuit structure is provided including a first transistor, a second transistor, a power rail, a first metal via and a plurality of metal tracks. The first transistor includes a first fin above a substrate and a source feature. The second transistor includes a second fin and a drain feature. The power rail is formed between the first fin and the second fin and below the source feature and the drain feature. The first metal via is formed over the power rail and electrically connected to source or drain feature. The metal tracks are separated from each other. Gaps between any two adjacent metal tracks are identical to each other, each of the metal tracks overlapping the power rail has a first width, each of the metal tracks not overlapping the power rail has a second width, and the first width is greater than the second width.

20 Claims, 10 Drawing Sheets

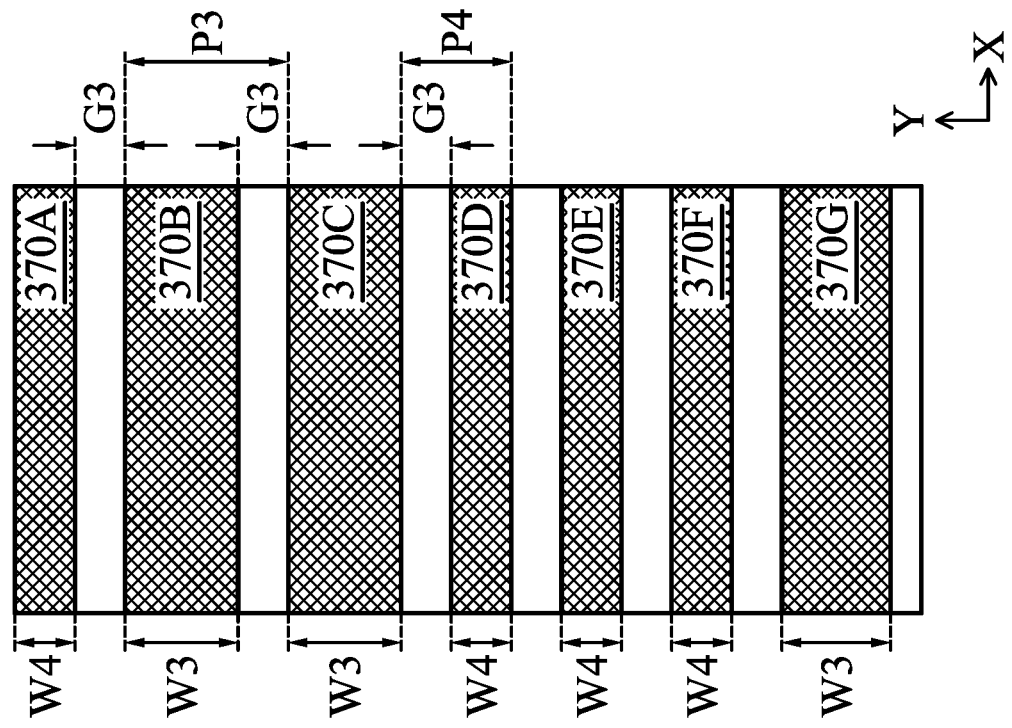
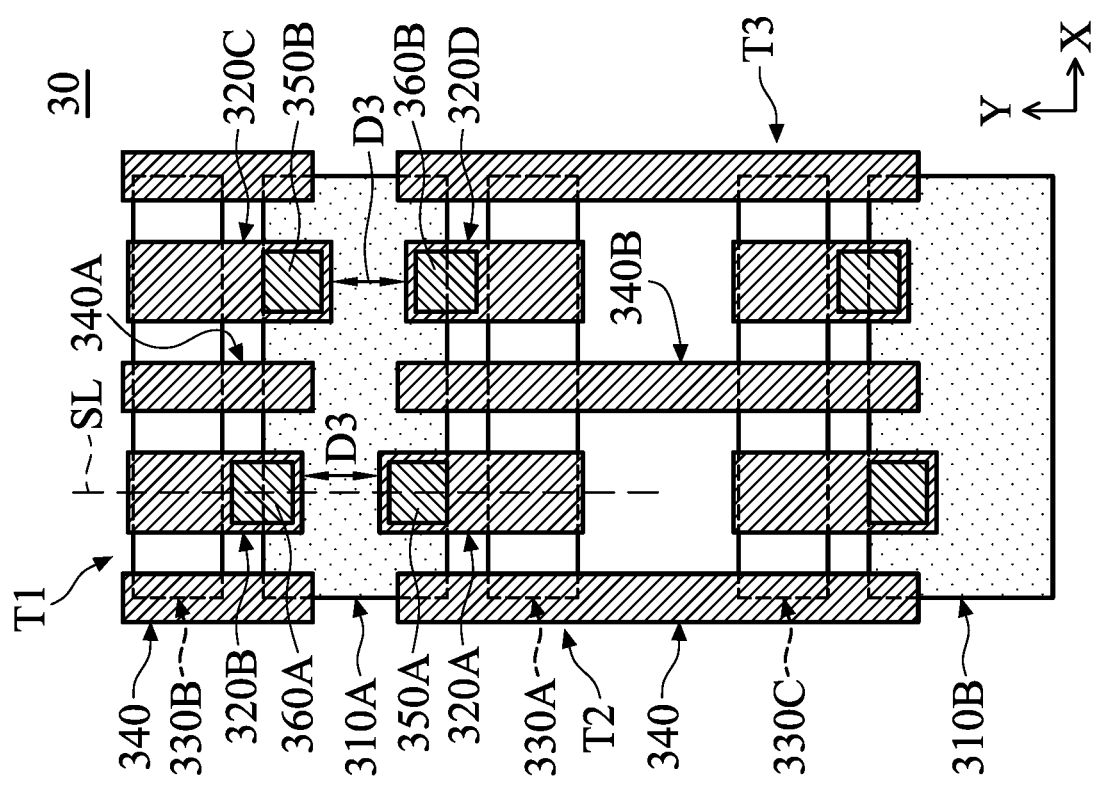
FIG. 3B
FIG. 3A

INTEGRATED CIRCUIT STRUCTURE

CROSS REFERENCE TO RELATED APPLICATIONS

This application claims the benefit of U.S. Provisional Application No. 62/751,137, filed on Oct. 26, 2018, the entirety of which is/are incorporated by reference herein.

BACKGROUND

The semiconductor integrated circuit (IC) industry has experienced rapid growth. Continual advances in semiconductor manufacturing processes have resulted in semiconductor device structures with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

Over the last four decades, the semiconductor fabrication industry has been driven by demands for greater performance (e.g., increased processing speed, memory capacity, etc.), a shrinking form factor, extended battery life, and lower cost. In response to these demands, the industry has continually reduced the size of semiconductor device components, so that modern day integrated chips may comprise millions or billions of semiconductor devices arranged on a single semiconductor die.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3A is another layout diagram of an integrated circuit structure in accordance with some embodiments.

FIG. 3B is another layout diagram of metal tracks of an integrated circuit structure in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1A:
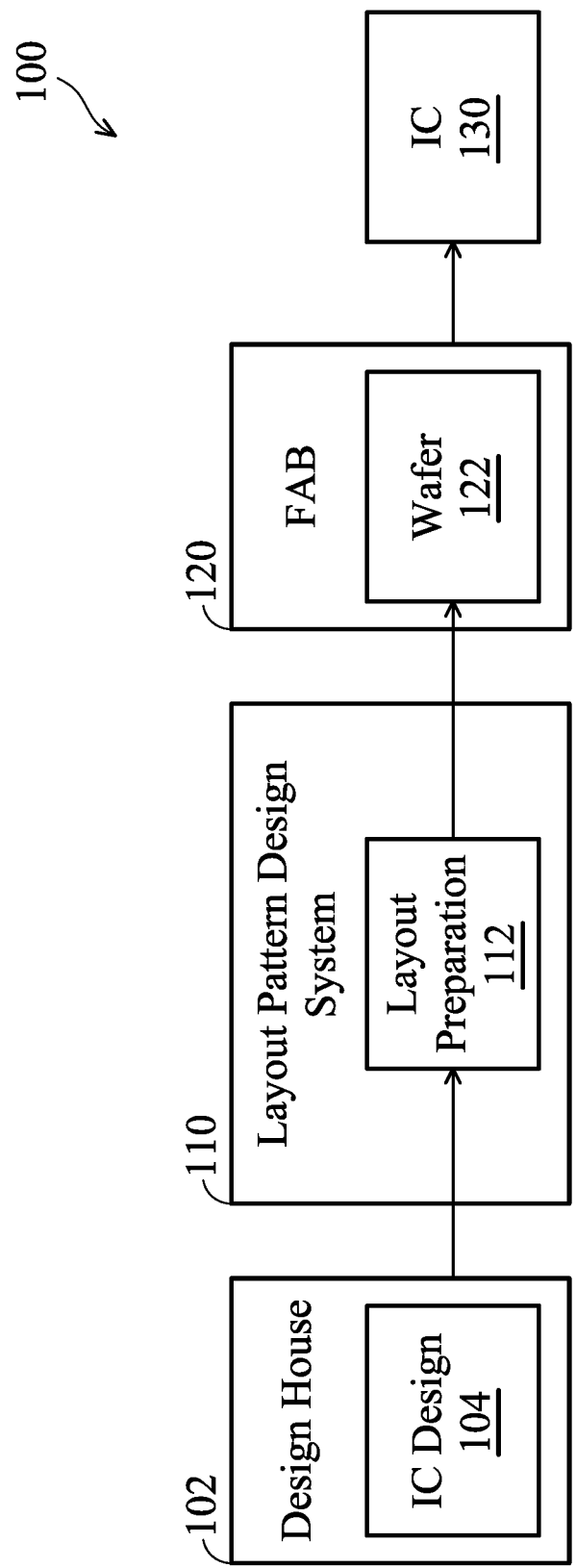
FIG. 1A is a simplified block diagram of an embodiment of an integrated circuit (IC) manufacturing system and an associated IC manufacturing flow.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device. Some of the features described below can be replaced or eliminated for different embodiments. Although some embodiments are discussed with operations performed in a particular order, these operations may be performed in another logical order.

FIG. 1A is a simplified block diagram of an embodiment of an integrated circuit (IC) manufacturing system 100 and an associated IC manufacturing flow, which may benefit from various aspects of the present disclosure. The IC manufacturing system 100 includes a plurality of entities, such as a design house 102, an layout pattern design system 110, and an IC manufacturer 120 (i.e., a fab), that interact with one another in the design, development, and manufacturing cycles and/or services related to manufacturing an integrated circuit (IC) 130. The IC 130 may include a plurality of semiconductor devices.

The plurality of entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 102, layout pattern design system 110, and IC manufacturer 120 may be owned by a single larger company, and may even coexist in a common facility and use common resources.

The design house (or design team) 102 generates an IC design 104. In some embodiments, the IC design 104 includes processing data which are used in layout pattern, mask design and semiconductor processes for manufacturing the IC 130. The IC design 104 may further include various geometrical patterns designed for the IC 130. The geometrical patterns correspond to patterns of metal, oxide, or semiconductor layers that make up the various components of the IC 130 to be fabricated. The various layers combine to form various IC features.

For example, a portion of the IC design 104 includes various IC features, such as active regions, gate electrodes, sources and drains, metal lines or vias of an interlayer interconnection, and openings for bonding pads, to be formed in a semiconductor substrate (such as a silicon wafer) and various material layers disposed on the semiconductor substrate. The design house 102 implements a proper design procedure to form the IC design 104. The design procedure may include logic design, physical design, and/or place and route.

The layout pattern design system 110 includes a layout preparation 112, and the layout preparation 112 receives the IC design 104 from the design house 102 to generate layout pattern for manufacturing the semiconductor devices on the wafer 122. Therefore, the semiconductor process is performed on the wafer 122 in the FAB 120 according to the layout patterns which were determined by the layout pattern design system 110.

The IC manufacturer 120, such as a semiconductor foundry, uses the processing parameters generated by the layout pattern design system 110 to fabricate the IC 130. The IC manufacturer 120 is an IC fabrication business that can include a myriad of manufacturing facilities for the fabrication of a variety of different IC products. For example, there may be a first manufacturing facility for the front end fabrication of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business.

In the present embodiment, a wafer 122 is fabricated using one or more masks to form the IC 130. The semiconductor wafer includes a silicon substrate or another proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The wafer 122 may further include various doped regions, dielectric features, and multilevel interis connected to (formed at subsequent manufacturing steps).

Figure 1B:
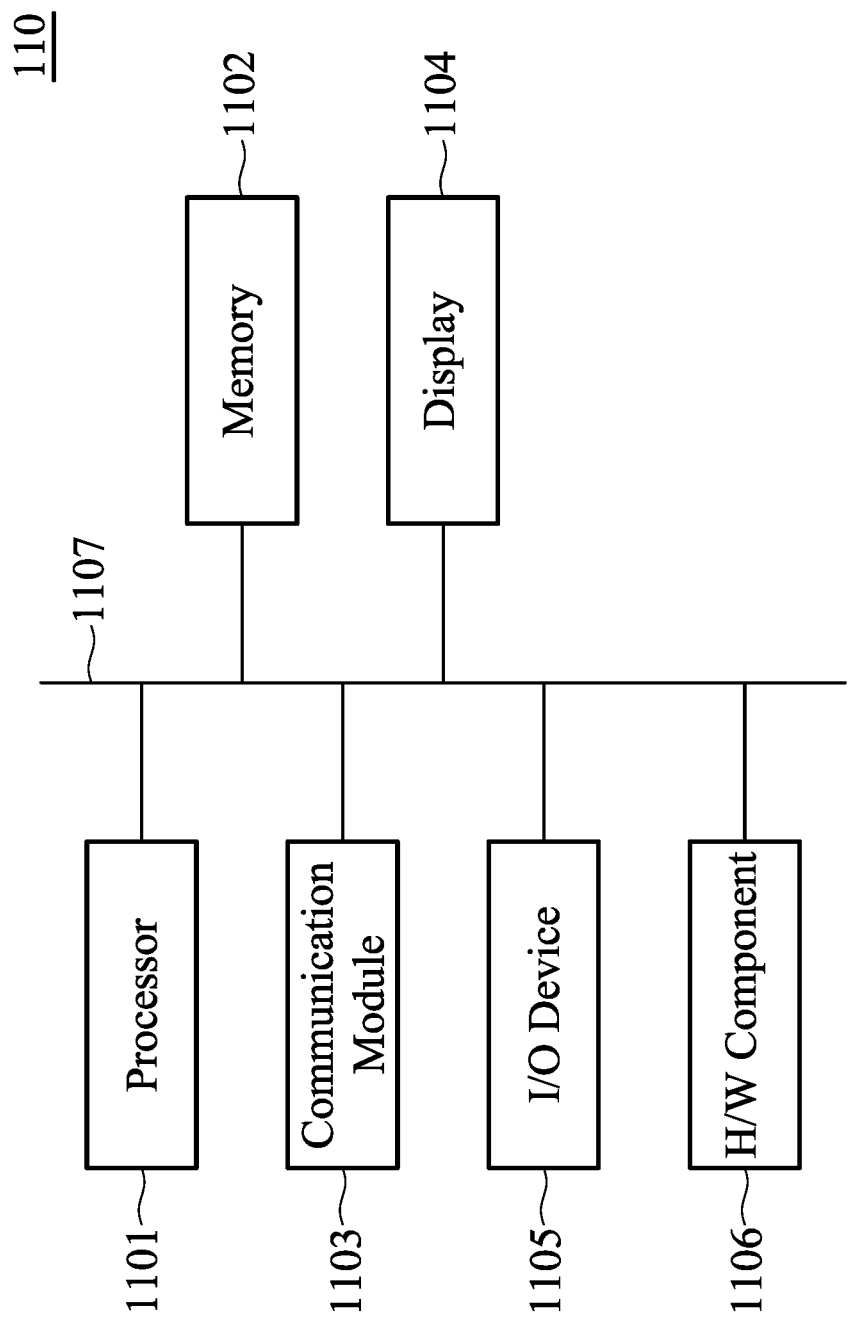
FIG. 1B is a more detailed block diagram of the layout pattern design system shown in FIG. 1A according to various aspects of the present disclosure.

FIG. 1B is a more detailed block diagram of the layout pattern design system 110 shown in FIG. 1A according to various aspects of the present disclosure. One or more of the tools and systems and operations described with respect to FIGS. 2-6 is realized in some embodiments by the layout pattern design system 110 of FIG. 1B. The etching system 100 includes a processor 1101, a memory 1102, a communication module 1103, a display 1104, an input/output (I/O) device 1105, and one or more hardware components 1106 communicatively coupled via a bus 1107 or another interconnection communication mechanism.

The processor 1101 could include a digital signal processor (DSP), a microcontroller (MCU), a central-processing unit (CPU) or a plurality of parallel processors relating the parallel processing environment to implement the operating system (OS), firmware, driver and/or other applications of the layout pattern design system 110.

The memory 1102 comprises, in some embodiments, a random access memory (RAM) or another dynamic storage device or read only memory (ROM) or other static storage devices, coupled to the bus 1107 for storing data and/or instructions to be executed by the processor 1101. The memory 1102 is also used, in some embodiments, for storing temporary variables or other intermediate information during the execution of instructions to be executed by the processor 1101.

The communication module 1103 is operable to communicate information such as IC design layout files with the other components in the IC manufacturing system 100, such as design house 102. Examples of communication modules may include Ethernet cards, 802.11 WiFi devices, cellular data radios, and/or other suitable devices known in the art.

The display 1104 is utilized to display the processing data and processing parameter the IC 130. The display 1104 can be a liquid-crystal panel or a touch display panel. The I/O device 1105 includes an input device, an output device and/or a combined input/output device for enabling user interaction with the layout pattern design system 110. An input device comprises, for example, a keyboard, keypad, mouse, trackball, trackpad, and/or cursor direction keys for communicating information and commands to the processor 1101. An output device comprises, for example, a display, a printer, a voice synthesizer, etc. for communicating information to the user.

Figure 2B:
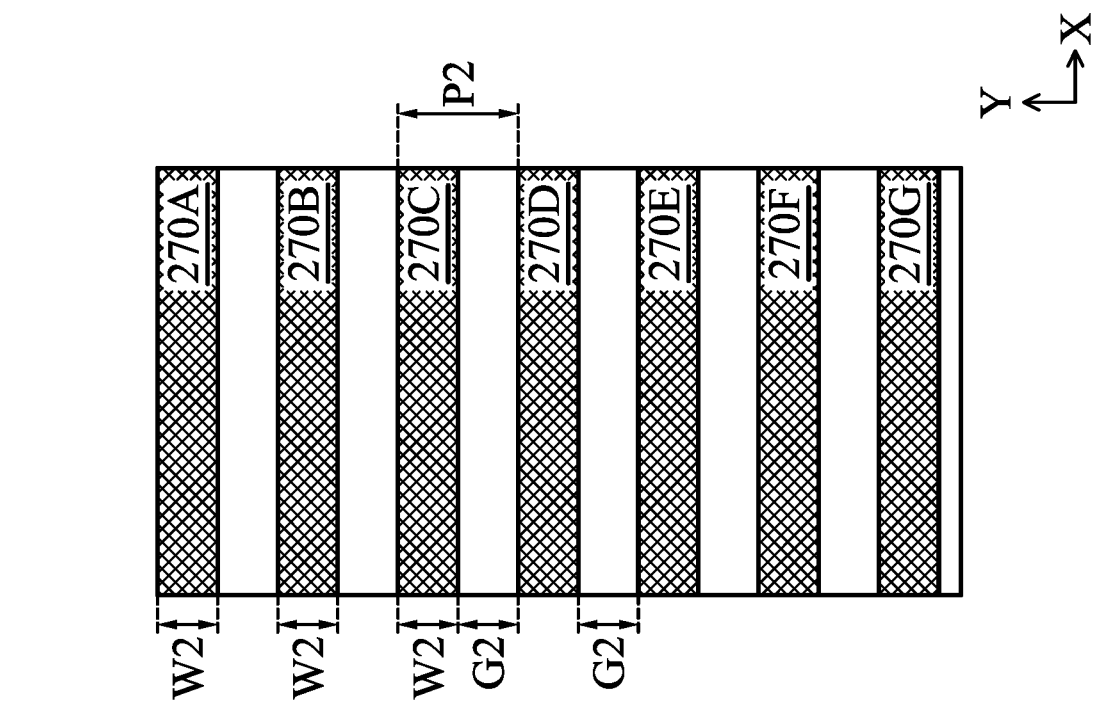
FIG. 2B is a layout diagram of metal tracks of an integrated circuit structure in accordance with some embodiments.
Figure 2A:
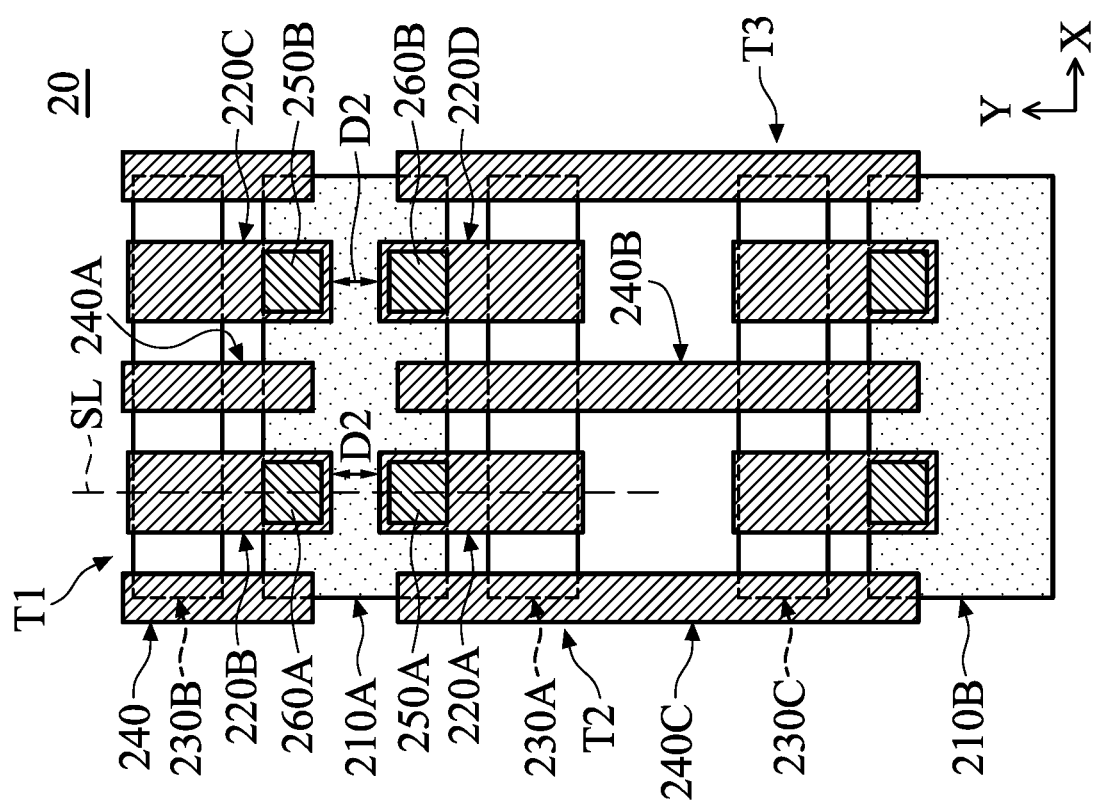
FIG. 2A is a layout diagram of an integrated circuit structure in accordance with some embodiments.
Figure 2C:
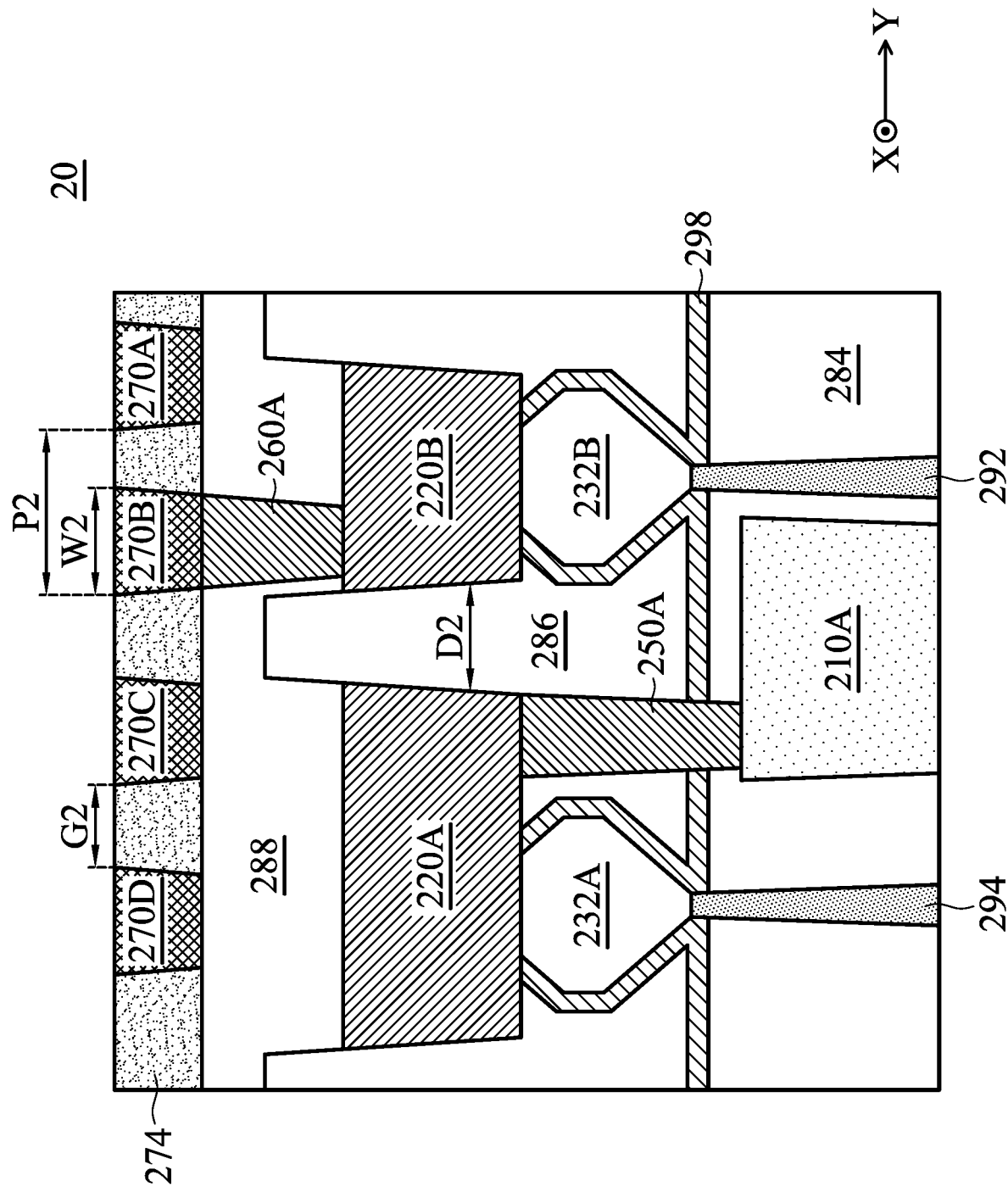
FIG. 2C is a cross-sectional diagram along the section line of an integrated circuit structure towards the opposite of X direction in accordance with some embodiments.

FIG. 2A is a layout diagram of an integrated circuit structure 20 in accordance with some embodiments. FIG. 2B is a layout diagram of metal tracks of an integrated circuit structure in accordance with some embodiments. FIG. 2C is a cross-sectional diagram along the section line of an integrated circuit structure towards the opposite of X direction in accordance with some embodiments. The integrated circuit structure 20 includes the power rails 210A~210B, the metal vias 250A~250B and 260A~260B, the metal tracks 270A~270G, the metal contacts 220A~220D and the poly-silicon portions 240A~240C. Specifically, the integrated circuit structure 20 includes several transistors T1~T3 and their related interconnecting structures (such as the metal contacts 220A~220D and the metal vias 250A~250B and 260A~260B). In order to illustrate clearly, three transistors T1, T2 and T3 and their related interconnecting structures are illustrated in FIG. 2A. Regarding the poly-silicon portions 240A~240C, they could be the gate electrodes of the above transistors T1~T3. For example, the poly-silicon portion 240A is the gate electrode of the transistor T1, the poly-silicon portion 240B is the gate electrode of the transistors T2 and T3. In addition, each of the transistors T1, T2 and T3 has its drain and source features (not shown) on opposite sides of the gate electrode.

In the formation of integrated circuits, standard cells are often used as base elements for building integrated circuits. The standard cells are placed and routed to form functional circuits. In typical layouts of standard cells, the power rails 210A and 210B are laid out on the boundaries of the standard cells. When a plurality of standard cells are placed as rows, the power rails of the standard cells in the same row are connected with each other to form a long power rail that may expand through, for example, thousands or more standard cells. In some embodiment, the power rail 210A is arranged between the standard cells of $N^{th}$ row and $N+a^{th}$ row, and the power rail 210B is arranged between the standard cells of $N+1^{th}$ row and $N+2^{th}$ row. In some embodiments, the standard cell of $N^{th}$ row includes the transistor T1, the standard cell of $N+1^{th}$ row includes the transistor T2, and the standard cell of $N+2^{th}$ row includes the transistor T3.

In some embodiments, the integrated circuit structure 20 may include at least one power rail 210A, which is metal interconnect wires arranged within a back-end-of-the line (BEOL) and configured to provide a voltage potential to a plurality of transistor devices on the integrated circuit structure 20. For example, the integrated circuit structure 20 may include the power rail 210A held at a source voltage potential (Vs) or held at a drain voltage potential (Vs) or held at a ground voltage potential.

Furthermore, as shown in FIG. 2A, the metal vias 250A~250B and 260A~260B overlap the power rail 210A. The metal vias 250A~250B and 260A~260B are formed over the power rail 210A of the integrated circuit structure 20. In some embodiments, the shape of each of the metal vias 250A~250B and 260A~260B could be a square or a rectangle.

The metal contacts 220A~220D extend in the Y direction (second direction) and partially overlap the power rail 210A. The second direction is perpendicular to the first direction. The metal contacts 220A~220D are formed over the power rail 210A and below the metal tracks 270A~270D of the integrated circuit structure 20.

It should be noted that the metal vias 250A~250B and 260A~260B are arranged within the metal contacts 220A~220D from the top view as shown in FIG. 2A, which means that each of the metal vias 250A-250B and 260A-260B is surrounded by one of the metal contacts 220A~220D. Furthermore, the distance between two metal contacts 220C and 220D is D2 and the distance between two metal contacts 220C and 220D is also D2.

In addition, the metal tracks 270A~270G extend in the first direction and partially overlapping the power rails 210A~210B. It should be noted that the metal tracks 270A~270G belong the metal one (M1) which is above others such as the power rails 210A~210B, the metal vias 250A~250B and 260A~260B, the metal contacts 220A~220D and the poly-silicon 240. Accordingly, the metal tracks 270A~270D are formed above the metal vias 250A, and 260A and the power rail 210A of the integrated circuit structure 20. In order to illustrate clearly, the metal tracks 270A~270G are shown separately in FIG. 2B from other layouts in FIG. 2A.

As shown in FIG. 2C, the metal tracks 270B and 270C overlap the power rail 210A. The metal tracks 270B and 270C could be partially or totally overlap the power rail 210A. In addition, the metal tracks 270A, 270D, 270E and 270G do not overlap the power rail 210A. The metal track 270G overlap the power rail 210B. The metal track 270G could be partially or totally overlap the power rail 210B. In addition, the metal tracks 270A-270F do not overlap the power rail 210B.

In some embodiments, the metal tracks 270A~270G are separated from each other by a gap G2. Each of the metal tracks 270A~270G has a width W2. Therefore, the metal tracks 270A~270G has the same and fixed pitch P2. Specifically, the pitch P is the sum of the width W2 and the gap G2.

Referring again to FIG. 2C, the integrated circuit structure 20 is fabricated over a substrate (not shown). The substrate may be made of silicon, germanium, compound semiconductor (such as silicon carbide, gallium arsenic, indium arsenide, or indium phosphide), alloy semiconductor (such as silicon germanium, silicon germanium carbide, gallium arsenic phosphide, or gallium indium phosphide). In some embodiments, the substrate may include an epitaxial layer or have an epitaxial layer overlying a bulk semiconductor.

The integrated circuit structure 20 could be various device elements formed in the substrate. Examples of the various device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, or other suitable elements. Various processes may be used to form the various device elements, including deposition, etching, implantation, photolithography, annealing, and/or other applicable processes.

Afterwards, the power rail 210A is fabricated above the substrate to electrically connecting to metal or conductive material. The power rail 210A could be made of polysilicon, a metal material, another suitable conductive material, or a combination thereof. The power rail 210A may include, but is not limited to, copper, aluminum, tungsten, molybdenum, titanium, tantalum, ruthenium, palladium, platinum, cobalt, nickel, conductive metal oxides, or a combination thereof.

In addition, an insulating portion 284 (the first insulating portion) is formed above the substrate. In some embodiments, the insulating portion 284 is a shallow trench isolation (STI) region on a well region of the substrate. As shown in FIG. 2C, the power rail 210A is arranged within the insulating portion 284 and surrounded by the insulating portion 284. The insulating portion 284 is made of silicon oxide, silicon nitride, silicon oxynitride, fluoride-doped silicate glass (FSG), or another low-k dielectric material. The insulating portion 284 may be deposited by a deposition process, such as a chemical vapor deposition (CVD) process, a spin-on-glass process, or another applicable process.

In some embodiments, the power rail 210A is arranged between two fin structures (or fins) 292 and 294 which are formed over the substrate, and the power rail 210A is surrounded by the insulating portion 284. For example, the fin structure 292 is identical to or corresponding to the conductive portion 230B, and the fin structure 294 is identical to or corresponding to the conductive portion 230A. In other embodiments, the fin structure 292 is formed within the conductive portion 230B, and the fin structure 294 is formed within the conductive portion 230A. Specifically, the fin structures 292 and 294 are formed by etching the substrate. The substrate is partially removed to form recesses (or trenches). A photolithography process and an etching process may be used to form the recesses. As a result, the fin structures 292 and 294 are formed between the recesses.

Furthermore, two fin structures 292 and 294 are formed within the insulating portion 284. The fin structures 292 and 294 may be made of silicon, germanium, compound semiconductor (such as silicon carbide, gallium arsenic, indium arsenide, or indium phosphide), alloy semiconductor (such as silicon germanium, silicon germanium carbide, gallium arsenic phosphide, or gallium indium phosphide). The fin structures 292 and 294 could also be made of polysilicon, a metal material, another suitable conductive material, or a combination thereof.

Afterwards, the drain feature 232B and the source feature 232A are fabricated above the insulating portion 284 and contact the fin structures 294 and 292 respectively. It should be noted that the metal via 260A is electrically connected to the drain feature 232B of the transistor T1, and the metal via 250A is electrically connected to the source feature 232A of the transistor T2. In addition, although not shown in FIG. 2C, the metal via 250B is electrically connected to the source feature of the transistor T1, and the metal via 260B is electrically connected to the drain feature of the transistor T2. Moreover, a strained material is grown by an epitaxial (epi) process to form the source feature 232A and the drain feature 232B. In some embodiments, the source feature 232A and the drain feature 232B may include Ge, SiGe, InAs, InGaAs, InSb, GaAs, GaSb, InAlP, InP, SiC, SiP, other applicable materials, or a combination thereof.

For example, the source feature 232A and the drain feature 232B are formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

In some embodiments, the source feature 232A and the drain feature 232B are surrounded by the spacer 298. The spacer 298 could be the contact etch stop layer (CESL). As shown in FIG. 2A, the spacer 298 is also formed between two insulating portions 284 and 286. The spacer 298 may be made of oxides, nitrides, oxynitrides, a high k material, a low k material, or a combination thereof. The precursor material or gaseous reactants of forming the spacer 298 may include TEOS (tetraethoxysilane), TRIES (triethoxysilane), BTBAS (bis-tertbutylaminor silane), O2, N2O, NO, other gas or materials, or a combination thereof. The spacer 298 may be formed by LPCVD, PECVD, HDP-CVD, APCVD, ATD, other suitable deposition method, or a combination thereof.

Afterwards, the metal contacts 220A and 220B are fabricated above the source feature 232A and the drain feature 232B respectively. Specifically, the metal contact 220A is formed over and contacts with the source feature 232A and the metal via 250A. The metal contacts 220A and 220B could be made of a metal material, suitable conductive material, or a combination thereof. The power rail 210A may include, but is not limited to, copper, aluminum, tungsten, molybdenum, titanium, tantalum, ruthenium, palladium, platinum, cobalt, nickel, conductive metal oxides, or a combination thereof. Furthermore, the distance between two metal contacts 220A and 220B is D2.

In addition, the insulating layer 288 and the metal via 260A are fabricated above the metal contacts 220A and 220B. As shown in FIG. 2C, the metal via 260A is formed within and surrounded by the insulating layer 288. The metal via 260A contacts the metal contact 220B so that the metal contact 220B and the drain feature 232B are electrically connected to the metal track 270B. The material of the metal via 262 could the same or similar to the material of the metal via 250A.

In some embodiments, the source feature 232A connects the metal contact 220A and electrically connects the power rail 210A through the metal via 250A. The drain feature 232B connects the metal contact 220B and electrically connects the metal track 270B through the metal via 260A.

The insulating layer 282 may include a high dielectric constant material (high-k material). The high-k material may include hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or a combination thereof. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO$_2$—Al$_2$O$_3$) alloy, other suitable materials, or a combination thereof.

In addition, an insulating portion 286 (the second insulating portion) is formed above the insulating portion 284. As shown in FIG. 2C, the source feature 232A and the drain feature 232B and the metal contacts 220A and 220B are arranged within the insulating portion 286 and surrounded by the insulating portion 286. The insulating portion 286 is made of silicon oxide, silicon nitride, silicon oxynitride, fluoride-doped silicate glass (FSG), or another low-k dielectric material. The insulating portion 286 may be deposited by a deposition process, such as a chemical vapor deposition (CVD) process, a spin-on-glass process, or another applicable process.

Afterwards, several metal tracks 270A-270D are fabricated above the insulating layer 288 and the insulating portion 286. In some embodiments, the metal tracks 270A-270D are separated from each other by a gap G2. Each of the metal tracks 270A-270D has a width W2. In other words, the metal tracks 270A-270D has the same and fixed pitch P2. It should be noted that the metal track 270B directly contacts the metal via 260A. Therefore, the drain feature 232B connects the metal contact 220B and electrically connects the metal track 270B through the metal via 260A.

For example, the metal tracks 270A-270D could be made of polysilicon, a metal material, another suitable conductive material, or a combination thereof. The metal tracks 270A-270D may include, but is not limited to, copper, aluminum, tungsten, molybdenum, titanium, tantalum, ruthenium, palladium, platinum, cobalt, nickel, conductive metal oxides, or a combination thereof.

Before the metal tracks 270A-270D are formed, as shown in FIG. 2C in accordance with some embodiments, several inter-layer dielectric (ILD) portions 274 are formed between any two of the adjacent metal tracks 270A-270D. The ILD portion 274 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD portion 274 may be formed by chemical vapor deposition (CVD), spin-on coating, or other applicable processes.

FIG. 3A is another layout diagram of an integrated circuit structure 30 in accordance with some embodiments. FIG. 3B is another layout diagram of metal tracks 370A-370G of an integrated circuit structure 30 in accordance with some embodiments. The integrated circuit structure 30 are similar to the integrated circuit structure 20 as shown in FIG. 2A-2C.

However, a flexible design is provided on the pitches P3 and P4 of the metal tracks 370A-370G of the integrated circuit structure 30. The pitches P2 of the integrated circuit structure 20 of FIG. 2A-2C are fixed and identical to each other. The metal tracks 370A-370G of the integrated circuit structure 30 have at least two different pitches P3 and P4 to improve the manufacturing process window of the integrated circuit structure 30.

In some embodiments, the metal contacts 320A-320D have different lengths. As shown in FIG. 3A, the lengths of the metal contacts 320B and 320D are shorter than the lengths of the metal contacts 320A and 320C.

Furthermore, the positions of the metal vias 360A and 360B are also adjusted accordingly since they are located within the area of the metal contacts 320B and 320D. Accordingly, the distance D3 between the two metal contacts 320C and 320D (and also the distance D3 between the two metal contacts 320A and 320B) is decreased and is smaller than the distance D2 of FIG. 2A. Therefore, the manufacturing process window of the integrated circuit structure 30 is larger than the manufacturing process window of the integrated circuit structure 20, and the yield rate for manufacturing the integrated circuit structure 30 could be improved and could be higher than the yield rate for manufacturing the integrated circuit structure 20.

Referring again to the embodiments of FIG. 3B, it should be noted that the metal tracks 370A-370G of FIG. 3B are arranged on the metal one which is above others of FIG. 3A. In order to illustrate clearly, the metal tracks 370A-370G are shown separately in FIG. 3B from others in FIG. 3A.

In the embodiments of FIG. 3B, the metal tracks 370B and 370C totally or partially overlap the metal vias 360A and 360B. Each distance between the metal tracks 370A and 370B, between the metal tracks 370C and 370D, between the metal tracks 370D and 370E, between the metal tracks 370E and 370F, and between the metal tracks 370F and 370G is the gap G3 respectively. Corresponding to the positions of the metal vias 360A and 360B, the metal tracks 370B and 370C have wider widths than the widths of other metal tracks 370A, 370D-370F.

As shown in FIG. 3B, the width W3 (the first width) of the metal tracks 370B and 370C are larger than the width W4 (the second width) of the metal tracks 370A and 370D~370F. In addition, the gap G3 between any two of the adjacent metal tracks 370A~370G is the same. Therefore, the pitch P3 (which is the sum of width W3 and gap G3) is larger than the pitch P4 (which is the sum of width W4 and gap G3).

In some embodiments, the amount of the metal tracks 370B and 370C with the width W3 is equal to or smaller than the amount of the metal tracks 370A and 370D~370F with the width W4 in accordance with the layout design of the metal vias 360A and 360B of FIG. 3A.

More specifically, the sum of the width W3 and the gap G3 is larger than the sum of the width W4 and the gap G3, and the sum of the width W3 and the gap G3 is smaller than three times the sum of the width W4 and the gap G3. In other words, the range of pitch P3 is between the size of pitch P4 to three times the size of pitch P4.

In order to arrange it so that distance D3 is larger than distance D2, the pitch P3 will be larger than the pitch P4 corresponding to the positions of the metal vias 360A and 360B and the metal contacts 320B and 320D. In addition, the pitch P3 less than three times the pitch P4 in order to provide adequate gap G3 for isolating each of the metal tracks 370A~370G. Therefore, the pitch P4 will not be too small and the risk of shorting the metal tracks 370A~370G could be prevented accordingly.

In some embodiments, the width W4 is equal to or larger than the gap G3, and the width W3 is larger than 1.5 times the gap G3 and smaller than 3 times the gap G3. Specifically, the width W3 should be large enough to provide the benefit of different widths for the metal tracks 370A~370G. However, the width W3 could not be extended to oppress or squeeze the space of the fixed gap G3. Therefore, both lower limit and upper limit are provided for designing the width W3 of the metal tracks 370B and 370C.

Figure 3C:
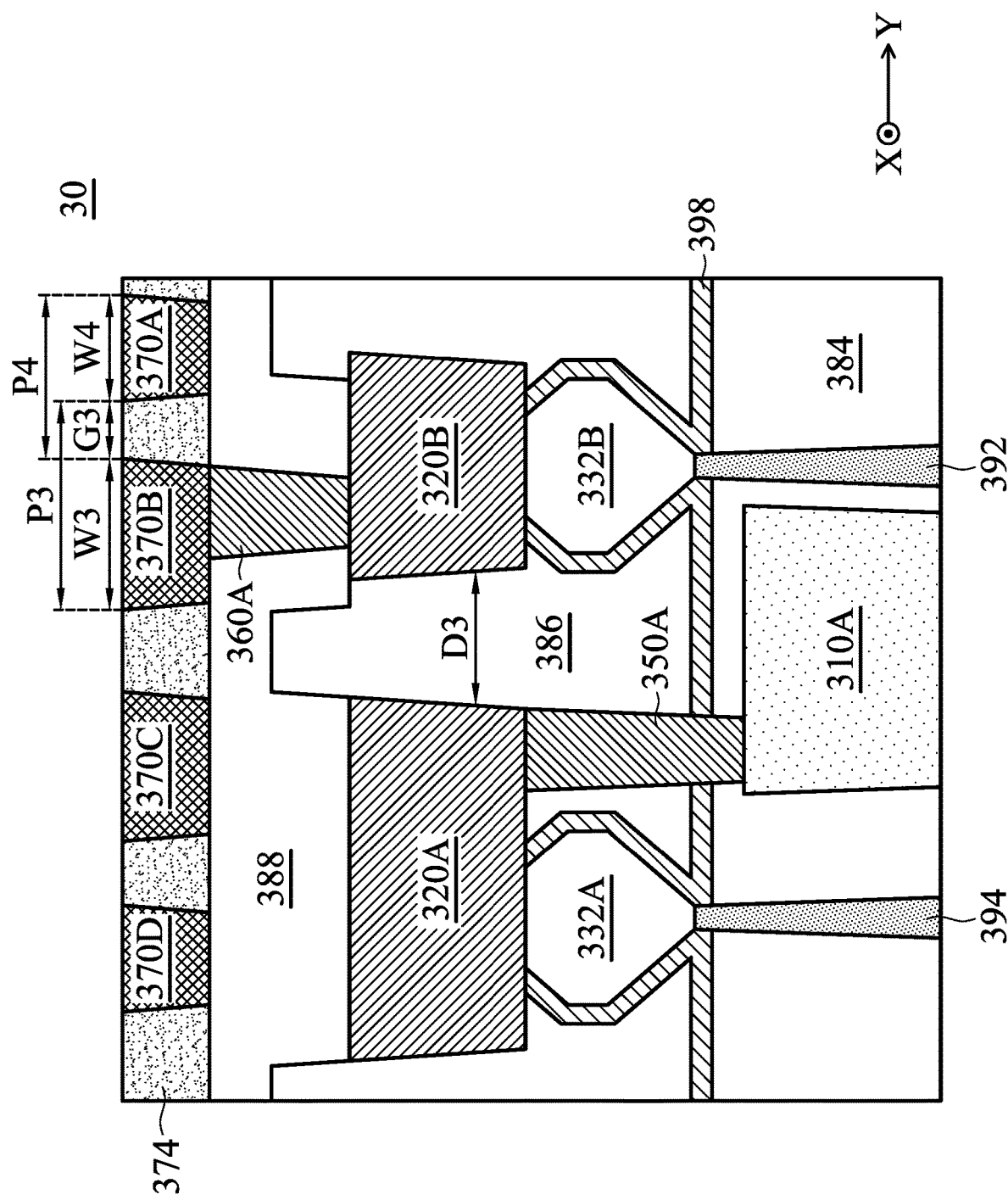
FIG. 3C is another cross-sectional diagram along the section line of an integrated circuit structure towards the opposite of X direction in accordance with some embodiments.

FIG. 3C is another cross-sectional diagram along the section line SL of an integrated circuit structure 30 towards the opposite of X direction in accordance with some embodiments. By providing the flexible design on the pitches P3 and P4 of the metal tracks 370A~370G of the integrated circuit structure 30, a large distance D3 between the metal contacts 320A and 320B could be obtained to enlarge the manufacturing process window of the integrated circuit structure 30.

Figure 4B:
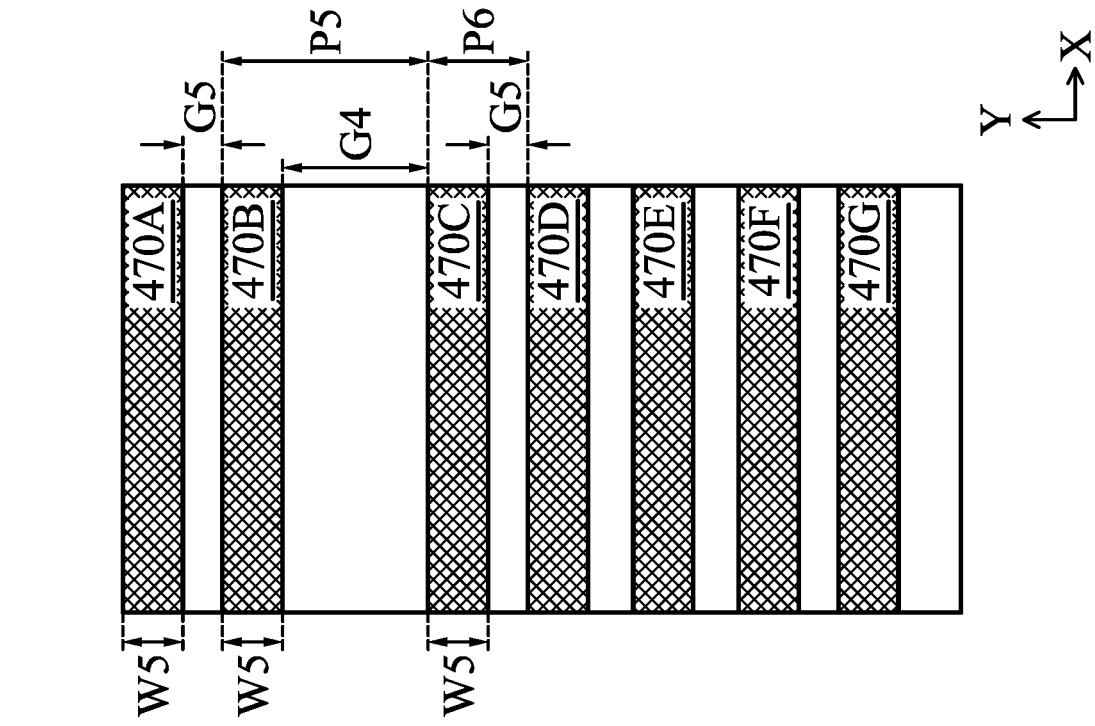
FIG. 4B is another layout diagram of metal tracks of an integrated circuit structure in accordance with some embodiments.
Figure 4A:
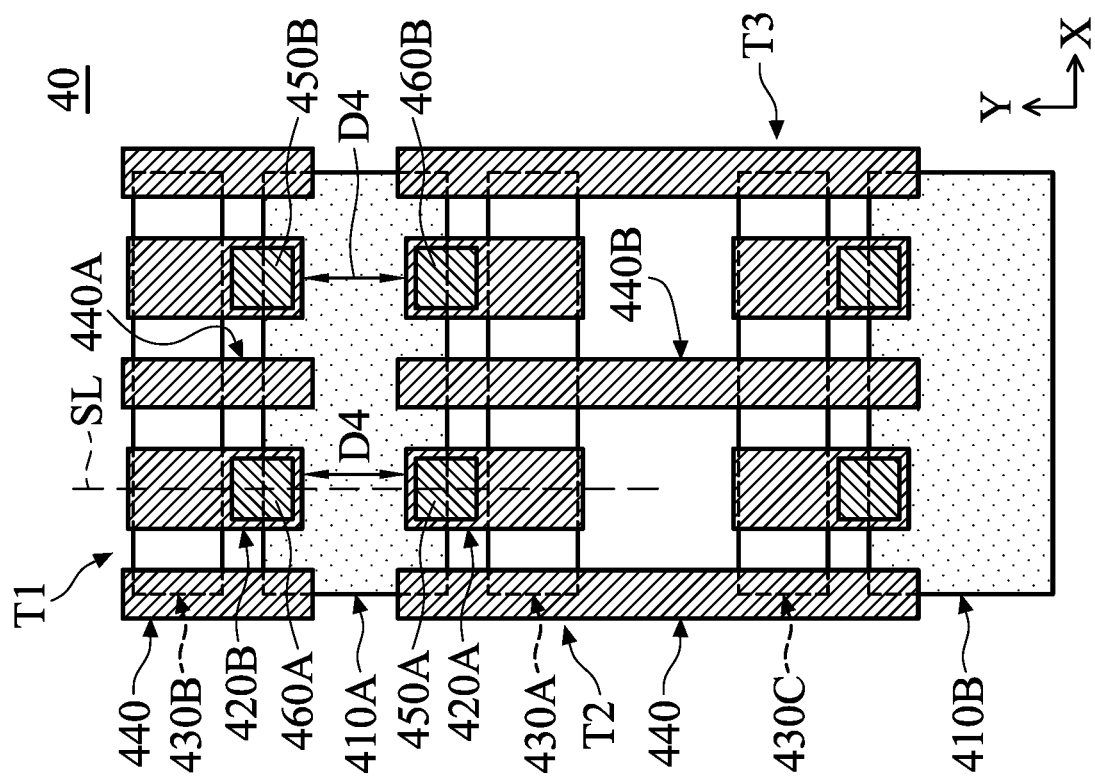
FIG. 4A is another layout diagram of an integrated circuit structure in accordance with some embodiments.

FIG. 4A is another layout diagram of an integrated circuit structure 40 in accordance with some embodiments. FIG. 4B is another layout diagram of metal tracks 470A~470G of an integrated circuit structure 40 in accordance with some embodiments. The integrated circuit structure 40 is similar to the integrated circuit structure 20 as shown in FIG. 2A~2C.

However, another flexible design is provided on the pitches P5 and P6 of the metal tracks 470A~470G of the integrated circuit structure 40. The pitches P2 of the integrated circuit structure 20 of FIG. 2A~2C are fixed and identical to each other. The metal tracks 470A~470G of the integrated circuit structure 40 have at least two different pitches P5 and P6 to improve the manufacturing process window of the integrated circuit structure 40.

In some embodiments, the metal contacts 420A~420D have shorter length than the metal contacts 220A~220D of FIG. 2A. Furthermore, the positions of the metal vias 450A~450B and 460A~460B are also adjusted accordingly since they are located within the area of the metal contacts 420A~420D. Accordingly, the distance D4 between the two metal contacts 420C and 420D is decreased and is smaller than the distance D2 of FIG. 2A.

Therefore, the manufacturing process window of the integrated circuit structure 40 is larger than the manufacturing process window of the integrated circuit structure 20, and the yield rate for manufacturing the integrated circuit structure 40 could be improved and could be higher than the yield rate for manufacturing the integrated circuit structure 20.

In the embodiments of FIG. 4B, the metal tracks 470B and 470C totally or partially overlap the metal vias 450A~450B and 460A~460B. Each distance between the metal tracks 470A and 470B, between the metal tracks 470C and 470D, between the metal tracks 470D and 470E, between the metal tracks 470E and 470F, and between the metal tracks 470F and 470G is the gap G5 respectively. The distance between the metal tracks 470B and 470C is the gap G4. Corresponding to the positions of the metal vias 450A~450B and 460A~460B, the gap G4 between the metal tracks 470B and 470C is larger than the gap G5 between any two of the adjacent metal tracks which are not both overlapping the power rail 410A (such as the metal tracks 470C and 470D).

As shown in FIG. 4B, the gap G4 (the first gap) between the metal tracks 470B and 470C are larger than the gap G5 (the second gap) between any two of the adjacent metal tracks 470A~470G which are not both overlapping the power rail 410A. In addition, the width W5 of each of the metal tracks 470A~470G is the same. Therefore, the pitch P5 (which is the sum of width W5 and gap G4) is larger than the pitch P6 (which is the sum of width W5 and gap G5).

In some embodiments, the amount of the metal tracks 470B and 470C separated by the gap G4 and overlapping the power rail 410A is equal to or smaller than the amount of the metal tracks 470A and 470D~470F which are not overlapping the power rail 410A in accordance with the layout design of the metal vias 450A~450B and 460A~460B of FIG. 4A.

More specifically, the sum of the width W5 and the gap G4 is larger than the sum of the width W5 and the gap G5, and the sum of the width W5 and the gap G4 is smaller than three times the sum of the width W5 and the gap G5. In other words, the range of pitch P5 is between the size of pitch P6 and three times the size of pitch P6.

In order to arrange distance D4, which is larger than distance D2, the pitch P5 will be larger than the pitch P6 corresponding to the positions of the metal vias 450A~450B and 460A~460B and the metal contacts 420C and 420D. In addition, in some embodiments, the pitch P5 less than three times the pitch P6 in order to provide adequate gap G5 for isolating each of the metal tracks 470A~470G. Therefore, the pitch P6 will not be very small and the risk of shorting the metal tracks 470A~470G could be prevented accordingly.

In some embodiments, the width W5 is equal to or larger than the gap G5, and the gap G4 is larger than one time of the width W5 and smaller than 3 times the width W5. Specifically, the gap G4 should be large enough to provide the benefit of different widths for the metal tracks 470A~470G. However, the gap G4 could not be extended extremely to oppress or squeeze the space of another gap G5. Therefore, both a lower limit and an upper limit are provided for designing the gap G4 between the metal tracks 470B and 470C.

Figure 4C:
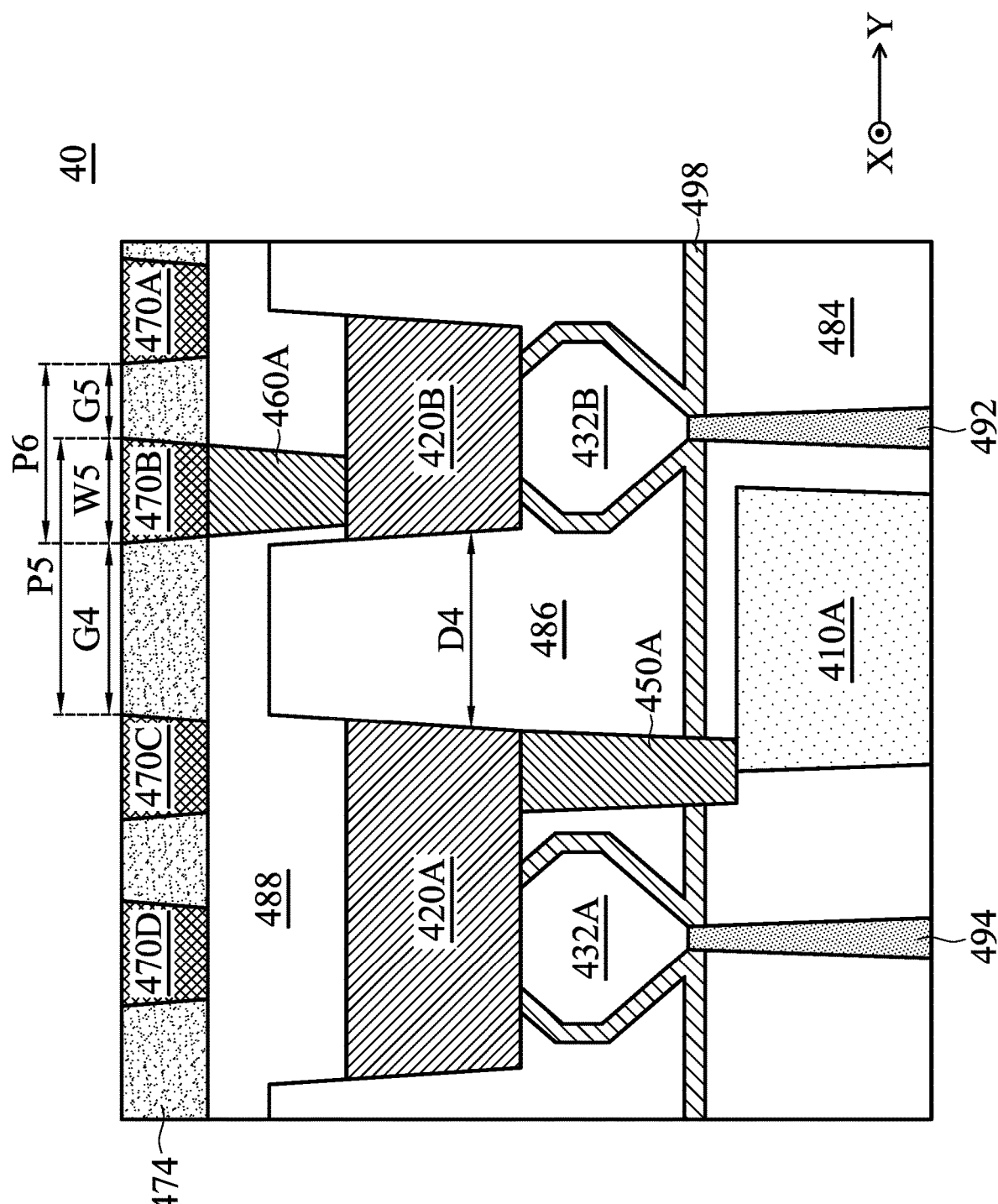
FIG. 4C is another cross-sectional diagram along the section line of an integrated circuit structure towards the opposite of X direction in accordance with some embodiments.

FIG. 4C is another cross-sectional diagram along the section line SL of an integrated circuit structure 40 towards the opposite of X direction in accordance with some embodiments. By providing the flexible design on the pitches P5 and P6 of the metal tracks 470A~470G of the integrated circuit structure 40, a large distance D4 between the metal contacts 420A and 420B could be obtained to enlarge the manufacturing process window of the integrated circuit structure 40.

Figure 5:
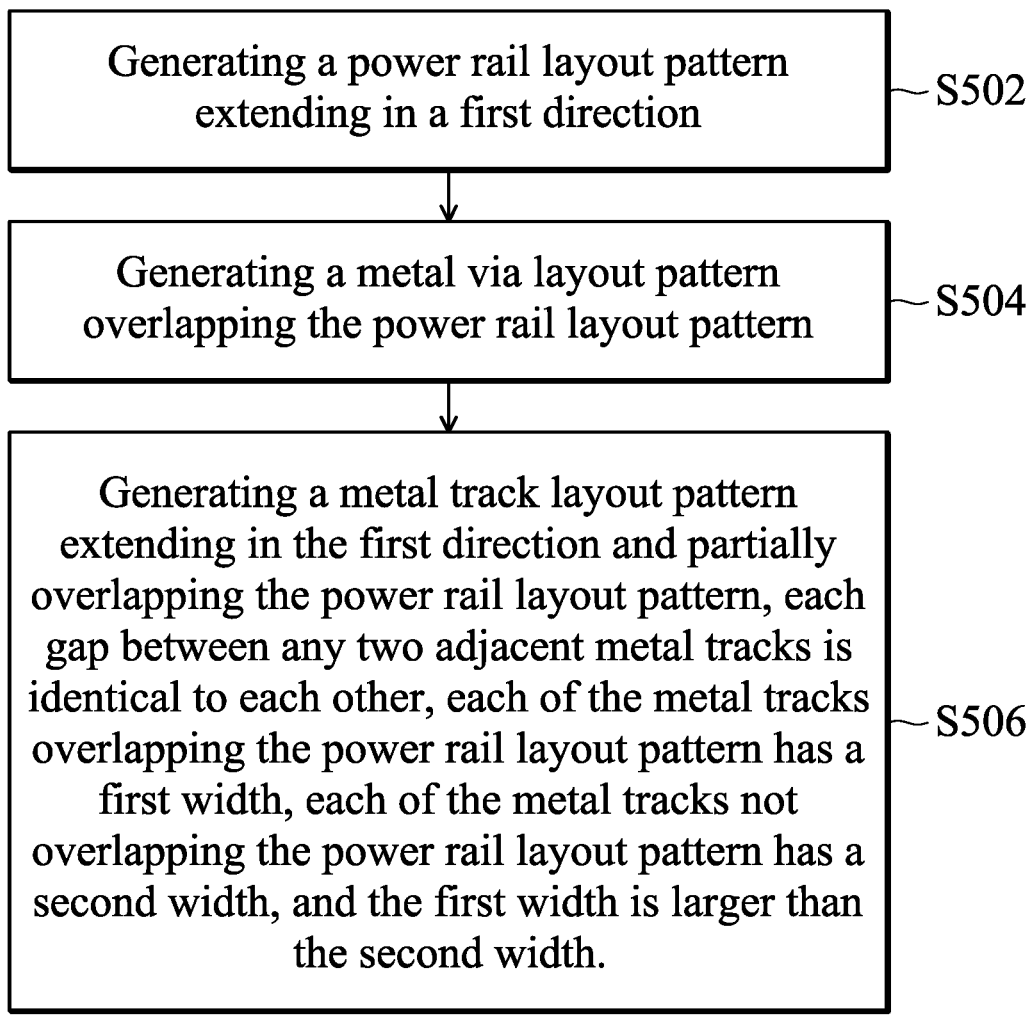
FIG. 5 is a flow chart illustrating the layout generating method in accordance with some embodiments.

FIG. 5 is a flow chart illustrating the layout generating method in accordance with some embodiments. In step S502, a power rail layout pattern extending in a first direction and corresponding to fabricating a power rail of an integrated circuit structure is generated. In step S504, a metal via layout pattern overlapping the power rail layout pattern and corresponding to fabricating a plurality of metal vias over the power rail of the integrated circuit structure is generated. In step S506, a metal track layout pattern extending in the first direction, partially overlapping the power rail layout pattern and corresponding to fabricating a plurality of metal tracks being separated from each other above the metal vias and the power rail of the integrated circuit structure is generated. Each gap between any two adjacent metal tracks is identical to every other gap, each of the metal tracks overlapping the power rail layout pattern has a first width, each of the metal tracks not overlapping the power rail layout pattern has a second width, and the first width is greater than the second width. In some embodiments, a metal layer layout pattern extending in a second direction and partially overlapping the power rail layout pattern and corresponding to fabricating a plurality of metal layers over the power rail and below the metal tracks of the integrated circuit structure is generated in the method. The second direction is perpendicular to the first direction.

Figure 6:
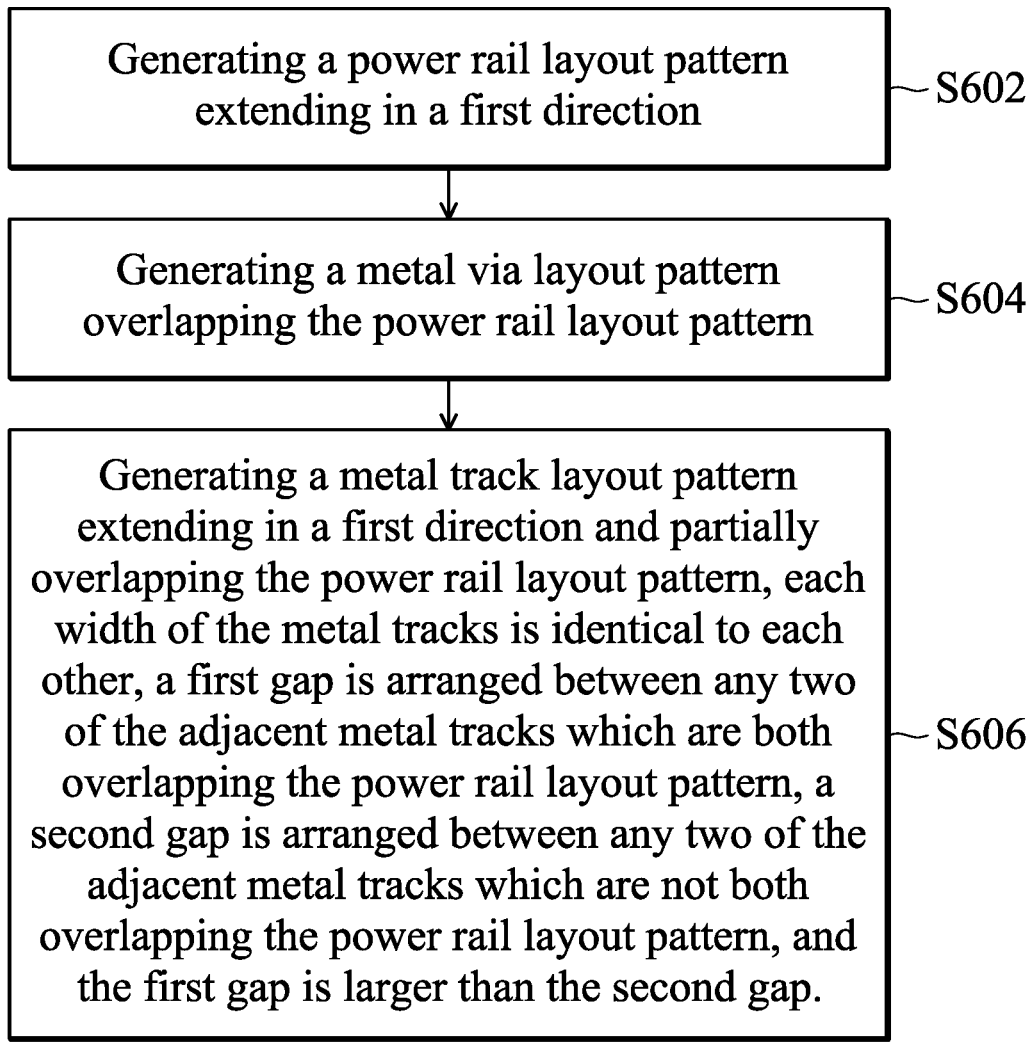
FIG. 6 is another flow chart illustrating the layout generating method in accordance with some embodiments.

FIG. 6 is another flow chart illustrating the layout generating method in accordance with some embodiments. In step S602, a power rail layout pattern extending in a first direction and corresponding to fabricating a power rail of an integrated circuit structure is generated. In step S604, a metal via layout pattern overlapping the power rail layout pattern and corresponding to fabricating a plurality of metal vias over the power rail of the integrated circuit structure is generated. In step S606, a metal track layout pattern extending in the first direction and partially overlapping the power rail layout pattern, and corresponding to fabricating a plurality of metal tracks being separated from each other over the metal vias and the power rail of the integrated circuit structure is generated. Each width of the metal tracks is identical to every other width, a first gap is arranged between any two of the adjacent metal tracks which are both overlapping the power rail layout pattern, a second gap is arranged between any two of the adjacent metal tracks which are not both overlapping the power rail layout pattern, and the first gap is larger than the second gap. In some embodiments, a metal layer layout pattern extending in a second direction and partially overlapping the power rail layout pattern and corresponding to fabricating a plurality of metal layers over the power rail and below the metal tracks of the integrated circuit structure is generated.

While disclosed methods in FIG. 5 and FIG. 6 are illustrated and described below as a series of acts or events, it will be appreciated that the illustrated ordering of such acts or events are not to be interpreted in a limiting sense. For example, some acts may occur in a different order and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

In some embodiments, one or more of the operations and/or functions of the tools and/or systems described with respect to FIGS. 1A-6 is/are implemented by specially configured hardware (e.g., by one or more application-specific integrated circuits or ASIC(s)) which is/are included) separate from or in lieu of the processor 610. Some embodiments incorporate more than one of the described operations and/or functions in a single ASIC.

In some embodiments, the operations and/or functions are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

In accordance with some embodiments, an integrated circuit structure is provided. The integrated circuit structure includes a first transistor, a second transistor, a power rail, a first metal via and a plurality of metal tracks. The first transistor includes a first fin above a substrate and a source feature on the first fin. The second transistor includes a second fin above the substrate and a drain feature on the second fin. The power rail is formed between the first fin and the second fin and below the source feature and the drain feature. The power rail, the first fin structure and the second fin structure extend in a first direction. The first metal via is formed over the power rail and electrically connected to the source feature or the drain feature. The metal tracks extend in the first direction and are separated from each other above the first metal via. Gaps between any two adjacent metal tracks are identical to each other, each of the metal tracks overlapping the power rail has a first width, each of the metal tracks not overlapping the power rail has a second width, and the first width is greater than the second width.

In accordance with some embodiments, an integrated circuit structure is provided. The integrated circuit structure includes a first transistor, a second transistor, a power rail, a first metal via and a plurality of metal tracks. The first transistor includes a first fin above a substrate and a source feature on the first fin. The second transistor includes a second fin above the substrate and a drain feature on the second fin. The power rail is formed between the first fin and the second fin and below the source feature and the drain feature. The power rail, the first fin structure and the second fin structure extend in a first direction. The first metal via is formed over the power rail and electrically connected to the source feature or the drain feature. The metal tracks extend in the first direction and are separated from each other above the first metal via. Widths of the metal tracks are identical to each other, a first gap is arranged between any two of the adjacent metal tracks which are both overlapping the power rail, a second gap is arranged between any two of the adjacent metal tracks which are not both overlapping the power rail, and the first gap is larger than the second gap.

In accordance with some embodiments, an integrated circuit structure is provided. The integrated circuit structure includes a first transistor, a second transistor, a power rail, several metal vias and a plurality of metal tracks. The first transistor includes a first fin above a substrate and a source feature on the first fin. The second transistor includes a second fin above the substrate and a drain feature on the second fin. The power rail is formed between the first fin and the second fin and below the source feature and the drain feature. The power rail, the first fin structure and the second fin structure extend in a first direction. The metal vias are arranged above the power rail. The metal tracks extend in the first direction and are separated from each other above the first metal via. Gaps between any two adjacent metal tracks are identical to each other, each of the metal tracks overlapping the power rail has a first width, each of the metal tracks not overlapping the power rail has a second width, and the first width is greater than the second width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure, comprising:
   a first transistor comprising a first fin above a substrate, and a source feature on the first fin;
   a second transistor comprising a second fin above the substrate, and a drain feature on the second fin;
   a power rail, formed between the first fin and the second fin and below the source feature and the drain feature, wherein the power rail, the first fin structure and the second fin structure extend in a first direction;
   a first metal via, formed over the power rail and electrically connected to the source feature or the drain feature; and
   a plurality of metal tracks extending in the first direction and separated from each other above the first metal via,
   wherein gaps between any two adjacent metal tracks are identical to each other, each of the metal tracks overlapping the power rail has a first width, each of the metal tracks not overlapping the power rail has a second width, and the first width is greater than the second width.

2. The integrated circuit structure as claimed in claim 1, further comprising:
   a first metal contact, formed extending in a second direction and partially overlapping the power rail and below the metal tracks, wherein the second direction is perpendicular to the first direction.

3. The integrated circuit structure as claimed in claim 2, wherein a layout of the first metal via is arranged within a layout of the first metal contact, and the first metal contact connects the first metal via to electrically connect the power rail or one of the metal tracks.

4. The integrated circuit structure as claimed in claim 3, further comprising:
   a second metal via, formed over the power rail; and
   a second metal contact, formed extending in the second direction and partially overlapping the power rail and below the metal tracks;
   wherein the power rail is electrically connected to the source feature of the first transistor through the first metal via and the first metal contact, the one of metal tracks with the first width is electrically connected to the drain feature of the second transistor through the second metal via and the second metal contact.

5. The integrated circuit structure as claimed in claim 1, wherein amount of the metal tracks with the first width is equal to or smaller than amount of the metal tracks with the second width.

6. The integrated circuit structure as claimed in claim 1, wherein sum of the first width and the gap is larger than the sum of the second width and the gap, and the sum of the first width and the gap is smaller than three times the sum of the second width and the gap.

7. The integrated circuit structure as claimed in claim 6, wherein the second width is equal to or larger than the gap, and the first width is greater than 1.5 times the gap and smaller than 3 times the gap.

8. An integrated circuit structure, comprising:
   a first transistor comprising a first fin above a substrate, and a source feature on the first fin;
   a second transistor comprising a second fin above the substrate, and a drain feature on the second fin;
   a power rail, formed between the first fin and the second fin and below the source feature and the drain feature, wherein the power rail, the first fin structure and the second fin structure extend in a first direction;

a first metal via formed over the power rail and electrically connected to the source feature or the drain feature; and a plurality of metal tracks, extending in the first direction and separated from each other over the first metal via and the power rail of the integrated circuit structure, wherein the widths of the metal tracks are identical to each other, a first gap is arranged between any two of the adjacent metal tracks which are both overlapping the power rail, a second gap is arranged between any two of the adjacent metal tracks which are not both overlapping the power rail, and the first gap is larger than the second gap.

9. The integrated circuit structure as claimed in claim 8, further comprising:

a first metal contact extending in a second direction and partially overlapping the power rail and below the metal tracks, wherein the second direction is perpendicular to the first direction.

10. The integrated circuit structure as claimed in claim 9, wherein layout of the first metal via is arranged within a layout of the first metal contact, and the first metal contact connects the first metal via to electrically connect the power rail or one of the metal tracks.

11. The integrated circuit structure as claimed in claim 10, further comprising:

a second metal via, formed over the power rail; and a second metal contact, formed extending in the second direction and partially overlapping the power rail and below the metal tracks;

wherein the power rail is electrically connected to the source feature of the first transistor through the first metal via and the first metal contact, the one of the metal tracks which is overlapping the power rail is electrically connected to the drain feature of the second transistor through the second metal via and the second metal contact.

12. The integrated circuit structure as claimed in claim 8, wherein amount of the metal tracks which are overlapping the power rail is equal to or smaller than amount of the metal tracks which are not overlapping the power rail.

13. The integrated circuit structure as claimed in claim 8, wherein sum of the width and the first gap is larger than the sum of the width and the second gap, and the sum of the width and the first gap is smaller than three times the sum of the width and the second gap.

14. The integrated circuit structure as claimed in claim 13, wherein the width is equal to or larger than the second gap, and the first gap is larger than the width and smaller than three times the width.

15. An integrated circuit structure, comprising:

a first transistor comprising a first fin above a substrate, and a source feature on the first fin;

a second transistor comprising a second fin above the substrate, and a drain feature on the second fin;

a power rail, formed between the first fin and the second fin and below the source feature and the drain feature, wherein the power rail, the first fin structure and the second fin structure extend in a first direction;

a plurality of metal contacts, extending in a second direction and arranged above the power rail, wherein the second direction is perpendicular to the first direction;

a plurality of metal vias, arranged above the power rail; and a plurality of metal tracks, extending in the first direction and partially overlapping the power rail and arranged over the metal vias and the metal contacts, wherein a portion of the metal tracks are configured to have a first pitch, another portion of the metal tracks are configured to have a second pitch, and the first pitch is larger than the second pitch.

16. The integrated circuit structure as claimed in claim 15, wherein the source feature connects one of the metal contacts and electrically connects the power rail through the connected metal via, and the drain feature connects another one of the metal contacts and electrically connects one of the metal tracks which is overlapping the power rail through the connected metal via.

17. The integrated circuit structure as claimed in claim 16, further comprising:

a first insulating portion, arranged above the substrate, wherein the power rail is arranged within the first insulating portion; and a second insulating portion, arranged above the first insulating portion, wherein the metal contacts, the metal vias, the source feature and the drain feature are arranged within the second insulating portion, and the metal tracks are arranged above the second insulating portion.

18. The integrated circuit structure as claimed in claim 15, wherein the amount of the metal tracks which are overlapping the power rail is equal to or smaller than the amount of the metal tracks which are not overlapping the power rail.

19. The integrated circuit structure as claimed in claim 15, wherein the first pitch comprises a first width and a gap, the second pitch comprises a second width and a gap, the gaps between adjacent metal tracks are identical to each other, the first width is greater than the second width, each of the metal tracks overlapping the power rail has the first width, each of the metal tracks not overlapping the power rail has the second width.

20. The integrated circuit structure as claimed in claim 15, wherein the first pitch comprises a first gap and a width, the second pitch comprises a second gap and a width, the widths of the metal tracks are identical to each other, the first gap is larger than the second gap, the first gap is arranged between any two of the adjacent metal tracks which are both overlapping the power rail, and the second gap is arranged between any two of the adjacent metal tracks which are not both overlapping the power rail.

* * * * *